US007741922B2

(12) United States Patent
Lee et al.

(10) Patent No.: US 7,741,922 B2
(45) Date of Patent: Jun. 22, 2010

(54) SWITCH, NEGATIVE RESISTANCE CELL, AND DIFFERENTIAL VOLTAGE CONTROLLED OSCILLATOR USING THE SAME

(75) Inventors: In young Lee, Daejeon (KR); Seok-Ju Yun, Daejeon (KR); Sang-Gug Lee, Daegu (KR); Seong Hoon Choi, Seoul (KR); Chang Sun Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 50 days.

(21) Appl. No.: 12/257,920

(22) Filed: Oct. 24, 2008

(65) Prior Publication Data

US 2009/0108946 A1  Apr. 30, 2009

(30) Foreign Application Priority Data

Oct. 24, 2007  (KR) .................... 10-2007-0107435

(51) Int. Cl.
*H01L 27/088* (2006.01)
*H03B 5/02* (2006.01)
*H03B 5/04* (2006.01)
*H03B 5/06* (2006.01)
*H03B 5/12* (2006.01)
*H03K 3/354* (2006.01)

(52) U.S. Cl. .................... 331/108 C; 331/117 FE; 257/401

(58) Field of Classification Search ............. 331/108 C, 331/116 R, 116 FE, 116 M, 117 R, 117 FE, 331/117 D; 257/368, 386–389, 401

See application file for complete search history.

(56) References Cited

U.S. PATENT DOCUMENTS 5,352,939 A * 10/1994 Hirabayashi et al. .......... 326/83

FOREIGN PATENT DOCUMENTS

| KR | 1999-0050403 | 7/1999 |
| KR | 2006-0030932 A | 4/2006 |
| KR | 2007-0052143 A | 5/2007 |
| WO | WO-2005/034357 A1 | 4/2005 |

OTHER PUBLICATIONS

De Ranter et al., "A 0.25μm CMOS 17GHz VCO", 2001 IEEE International Solid-State Circuits Conference, 3 pages.

(Continued)

*Primary Examiner*—David Mis
(74) *Attorney, Agent, or Firm*—Rabin & Berdo, P.C.

(57) ABSTRACT

The present invention relates to a switch, a negative resistance cell, and a differential voltage controlled oscillator using the same. The present invention includes a first signal line provided in a first direction, a second signal line provided in parallel with the first signal line, and first to fourth gate electrodes, first to third source electrodes, and first to fourth drain electrodes formed between the first signal line and the second signal line, and provides a switch having electrodes in the order of the first gate electrode, the first drain electrode, the second gate electrode, the first source electrode, the third gate electrode, the second drain electrode, the fourth gate electrode, the second source electrode, the fifth gate electrode, the third drain electrode, the sixth gate electrode, the third source electrode, the seventh gate electrode, the fourth drain electrode, and the eighth gate electrode. According to the present invention, a differential voltage controlled oscillator for RF oscillation operation in the broadband area is realized by minimizing generation of parasitic components.

20 Claims, 5 Drawing Sheets

OTHER PUBLICATIONS

Cao et al., "Millimeter-Wave Voltage-Controlled Oscillators in 0.13-μm CMOS Technology", IEEE Journal of Solid-State Circuits, vol. 41, No. 6, Jun. 2006, pp. 1297-1304.

Hajimiri et al., "A General Theory of Phase Noise in Electrical Oscillators", IEEE Journal of Solid-State Circuits, vol. 33, No. 2, Feb. 1998, pp. 179-194.

* cited by examiner

SWITCH, NEGATIVE RESISTANCE CELL, AND DIFFERENTIAL VOLTAGE CONTROLLED OSCILLATOR USING THE SAME

CROSS-REFERENCE TO RELATED APPLICATION

This application claims priority to and the benefit of Korean Patent Application No. 10-2007-0107435 filed in the Korean Intellectual Property Office on Oct. 24, 2007, the entire contents of which are incorporated herein by reference.

BACKGROUND OF THE INVENTION (a) Field of the Invention

The present invention relates to a switch, a negative resistance cell, and a differential voltage controlled oscillator using the same. More particularly, the present invention relates to a switch, a negative resistance cell, and a differential voltage controlled oscillator using the same for minimizing generation of a parasitic component.

(b) Description of the Related Art

A differential voltage controlled oscillator (DVCO) is a device for changing and outputting an oscillation frequency corresponding to an applied voltage, and is generally used for an analog voice synthesizer and a mobile communication terminal.

The DVCO used for the voice synthesizer generates sine waves, sawtooth waves, pulse waves, square waves, and triangular waves to generate various sound signals. The DVCO used for the mobile communication device is used for the phase locked loop (PLL) module to function as a local oscillator for allocating channels and converting frequencies into the radio frequency (RF) or the intermediate frequency (IF).

Also the DVCO is an essential constituent element for the wired/wireless transmitting/receiving system, and study on improving the performance of the DVCO is ongoing.

However, regarding the general DVCO, performance improvement and downsizing are limited since it is difficult to reduce the parasitic component and the realized area that are caused by the transistor structure and the length of the connection lines between elements by more than a predetermined level, and hence, methods for solving the problem are needed.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a switch, a negative resistance cell, and a differential voltage controlled oscillator using the same for minimizing the parasitic components and the realization area.

In one aspect of the present invention, a differential voltage controlled oscillator includes: a resonator for generating an oscillation frequency corresponding to an input voltage; a first output terminal and a second output terminal, respectively coupled to a first terminal and a second terminal of the resonator, for outputting the oscillation frequency; and a negative resistance cell driven in correspondence to the oscillation frequency. The negative resistance cell includes a switch, and the switch includes: a first signal line extended in a first direction; a second signal line formed to be parallel with the first signal line; a source electrode formed between the first and second signal lines; a first gate electrode arranged to be parallel with the source electrode and coupled to the first signal line; a second gate electrode provided to the opposite side of the first gate electrode with respect to the source electrode, and coupled to the second signal line; a first drain electrode provided to the opposite side of the source electrode with respect to the first gate electrode, and coupled to the second signal line; and a second drain electrode provided to the opposite side of the source electrode with respect to the second gate electrode, and coupled to the first signal line.

In another aspect of the present invention, a differential voltage controlled oscillator includes: a resonator for generating an oscillation frequency corresponding to an input voltage; a first output terminal and a second output terminal, respectively coupled to a first terminal and a second terminal of the resonator, for outputting the oscillation frequency; and a negative resistance cell driven in correspondence to the oscillation frequency. The negative resistance cell includes a switch, and the switch includes: a first signal line extended in a first direction; a second signal line formed to be parallel with the first signal line; and a first gate electrode to a fourth gate electrode, a first source electrode to a third source electrode, and a first drain electrode to a fourth drain electrode formed between the first signal line and the second signal line.

The electrodes are formed in the order of the first gate electrode, the first drain electrode, the second gate electrode, the first source electrode, the third gate electrode, the second drain electrode, the fourth gate electrode, the second source electrode, the fifth gate electrode, the third drain electrode, the sixth gate electrode, the third source electrode, the seventh gate electrode, the fourth drain electrode, and the eighth gate electrode.

In another aspect of the present invention, provided is a negative resistance cell included in a resonator for generating an oscillation frequency corresponding to an input voltage, and a differential voltage controlled oscillator for outputting the oscillation frequency through a first output terminal and a second output terminal and including a switch that is driven corresponding to the oscillation frequency. The switch includes: a first signal line extended in a first direction; a second signal line formed to be parallel with the first signal line; a source electrode formed between the first and second signal lines; a first gate electrode arranged to be parallel with the source electrode and coupled to the first signal line; a second gate electrode provided to the opposite side of the first gate electrode with respect to the source electrode, and coupled to the second signal line; a first drain electrode provided to the opposite side of the source electrode with respect to the first gate electrode, and coupled to the second signal line; and a second drain electrode provided to the opposite side of the source electrode with respect to the second gate electrode, and coupled to the first signal line.

In another aspect of the present invention, provided is a negative resistance cell included in a resonator for generating an oscillation frequency corresponding to an input voltage, and a differential voltage controlled oscillator for outputting the oscillation frequency through a first output terminal and a second output terminal and including a switch driven corresponding to the oscillation frequency. The switch includes: a first signal line extended in a first direction; a second signal line formed to be parallel with the first signal line; and a first gate electrode to a fourth gate electrode, a first source electrode to a third source electrode, and a first drain electrode to a fourth drain electrode formed between the first signal line and the second signal line.

The electrodes are formed in the order of the first gate electrode, the first drain electrode, the second gate electrode, the first source electrode, the third gate electrode, the second drain electrode, the fourth gate electrode, the second source electrode, the fifth gate electrode, the third drain electrode, the sixth gate electrode, the third source electrode, the seventh gate electrode, the fourth drain electrode, and the eighth gate electrode.

In another aspect of the present invention, a switch includes: a first signal line extended in a first direction; a second signal line formed to be parallel with the first signal line; a source electrode formed between the first and second signal lines; a first gate electrode arranged to be parallel with the source electrode and coupled to the first signal line; a second gate electrode provided to the opposite side of the first gate electrode with respect to the source electrode, and coupled to the second signal line; a first drain electrode provided to the opposite side of the source electrode with respect to the first gate electrode, and coupled to the second signal line; and a second drain electrode provided to the opposite side of the source electrode with respect to the second gate electrode, and coupled to the first signal line.

In another aspect of the present invention, a switch includes: a first signal line extended in a first direction; a second signal line formed to be parallel with the first signal line; and a first gate electrode to a fourth gate electrode, a first source electrode to a third source electrode, and a first drain electrode to a fourth drain electrode formed between the first signal line and the second signal line The electrodes are formed in the order of the first gate electrode, the first drain electrode, the second gate electrode, the first source electrode, the third gate electrode, the second drain electrode, the fourth gate electrode, the second source electrode, the fifth gate electrode, the third drain electrode, the sixth gate electrode, the third source electrode, the seventh gate electrode, the fourth drain electrode, and the eighth gate electrode.

According to the present invention, the switch, the negative resistance cell, and the differential voltage controlled oscillator using them for minimizing parasitic components and realization area are realized.

DETAILED DESCRIPTION OF THE EMBODIMENTS

Figure 1:
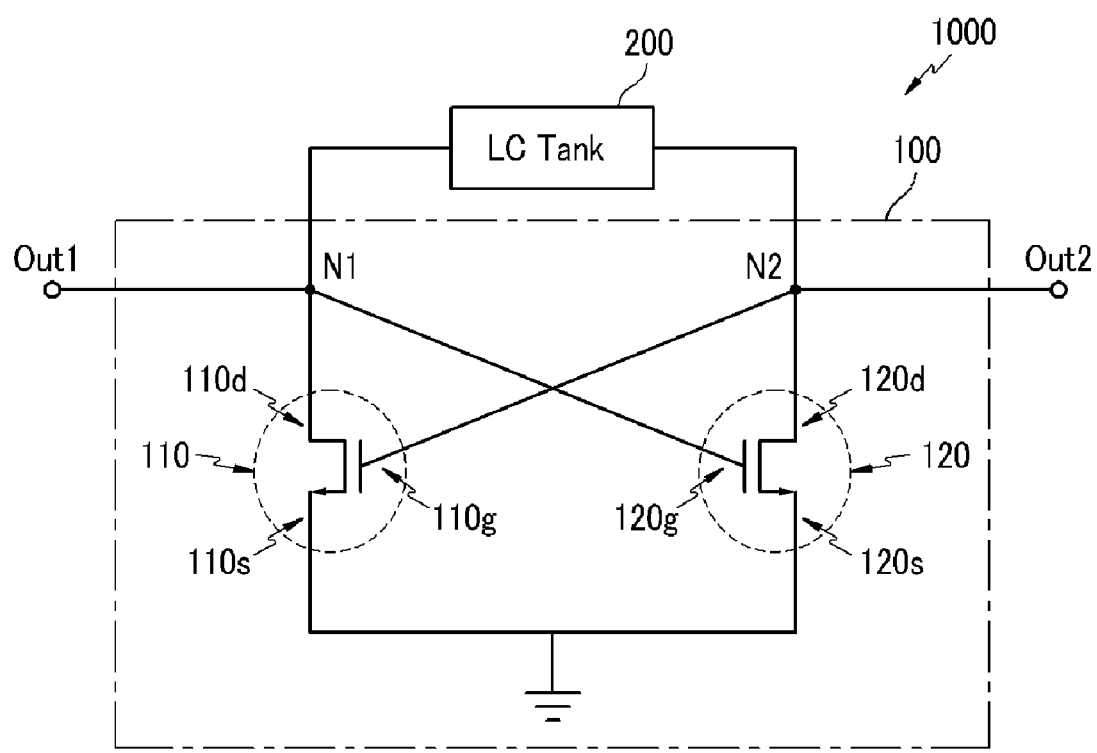
FIG. 1 is a schematic diagram of a differential voltage controlled oscillator 1000 according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element.

Throughout this specification, in addition, unless explicitly described to the contrary, the word "comprise" and variations such as "comprises" or "comprising", will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

FIG. 1 is a schematic diagram of a differential voltage controlled oscillator 1000 according to an exemplary embodiment of the present invention.

As shown in FIG. 1, the differential voltage controlled oscillator 1000 includes a negative resistance cell 100 and an LC tank 200.

The negative resistance cell 100 includes a switch formed by cross-coupled transistors 110 and 120. For reference, in FIG. 1, the transistor 110 and the transistor 120 are respectively shown to be formed as a transistor, and differing from this, they can be formed by a plurality of transistors coupled in parallel.

A drain 110d of the transistor 110 is coupled to an output terminal Out1 through a node N1, and a source 110s thereof is grounded. A gate 110g of the transistor 110 is coupled to a node N2.

A drain 120d of the transistor 120 is coupled to an output terminal Out2 through a node N2, and a source 120s is grounded. A gate 120g of the transistor 120 is coupled to the node N1.

A first terminal of the LC tank 200 is coupled to the node N1, and a second terminal is coupled to the node N2. The LC tank 200 is formed by coupling an inductor (not shown) and a capacitor (not shown) in parallel, and here, capacitance of the capacitor is changed according to an input voltage, and an oscillation frequency is changed corresponding to the voltage.

The negative resistance cell 100 of the differential voltage controlled oscillator 1000 according to the exemplary embodiment of the present invention will now be described with reference to drawings. A negative resistance cell included in the general differential voltage controlled oscillator will now be described with reference to FIG. 2 and FIG. 3.

Figure 2:
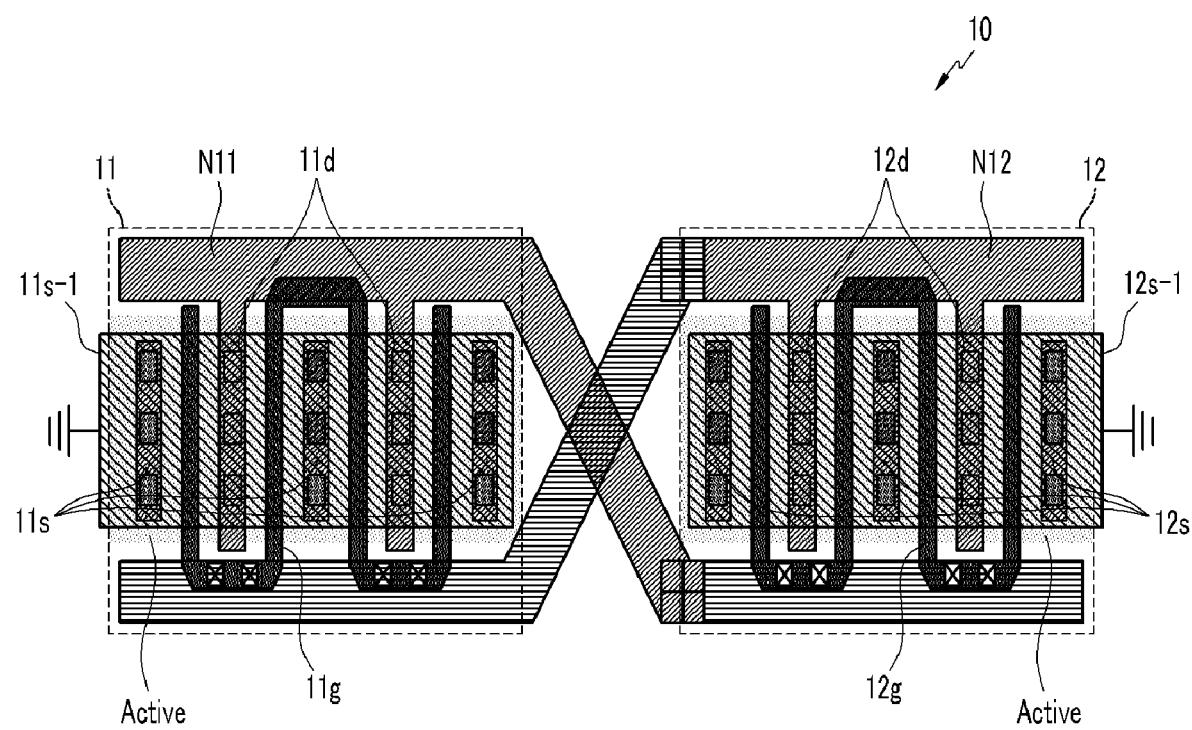
FIG. 2 is a detailed schematic diagram of a negative resistance cell 10 included in a general differential voltage controlled oscillator.

FIG. 2 is a detailed schematic diagram 26 a negative resistance cell 10 included in a general differential voltage controlled oscillator.

As shown in FIG. 2, the negative resistance cell 10 included in the differential voltage controlled oscillator is formed by a switch including a transistor 11 and a transistor 12.

A drain 11d of the transistor 11 is coupled to a node N11 coupled to an LC tank (not shown), and a source 11s is grounded through a source common connector (11s-1).

A drain 12d of the transistor 12 is coupled to a node N12 coupled to the LC tank (not shown), and a source 12s is grounded through a source common connector (12s-1).

A gate 11g of the transistor 11 is coupled to the node N12, and a gate 12g of the transistor 12 is coupled to the node N11.

The drains 11d and 12d of the transistors 11 and 12 have a junction with an active area. Also, while not shown in FIG. 2, the sources 11s and 12s of the transistors 11 and 12 obviously have a junction with the active area.

As shown in FIG. 2, the transistor 11 and the transistor 12 of the negative resistance cell 10 included in the general differential voltage controlled oscillator are formed to be symmetrical with each other. Therefore, the node N11 and the node N12 must be formed to be superimposed with each other, and parasitic resistance, parasitic inductance, and parasitic capacitance components that are caused by the superimposition structure are substantially increased, which cannot be ignored. As shown in FIG. 2, as the transistors 11 and 12 are formed, a mismatch caused by a gradient in the process for generating the two transistors 11 and 12 may occur.

Particularly, when the negative resistance cell 10 shown in FIG. 2 is used to manufacture the differential voltage controlled oscillator that is operable in the RF area, the oscillation frequency and frequency tuning range are substantially limited by the parasitic component and the mismatch, and phase noise performance is deteriorated.

Also, the negative resistance cell 10 shown in FIG. 2 substantially generates an undesired parasitic component as the lengths of the node N11 and the node N12 are increased.

A large parasitic component generated in the negative resistance cell 10 deteriorates the Q factor of the LC tank (200 in FIG. 1) to thus deteriorate the phase noise performance. The large parasitic component generated in the negative resistance cell 10 limits the frequency bandwidth of the oscillation frequency output by the general differential voltage controlled oscillator to be not greater than a predetermined level. Also, the large parasitic component generated in the negative resistance cell 10 limits the variable range of the output frequency of the LC tank (200 in FIG. 1). In order to realize an RF differential voltage controlled oscillator for outputting the RF oscillation frequency, a negative resistance cell 20 for reducing generation of the parasitic component compared to the negative resistance cell 10 shown in FIG. 2 is shown in FIG. 3.

Figure 3:
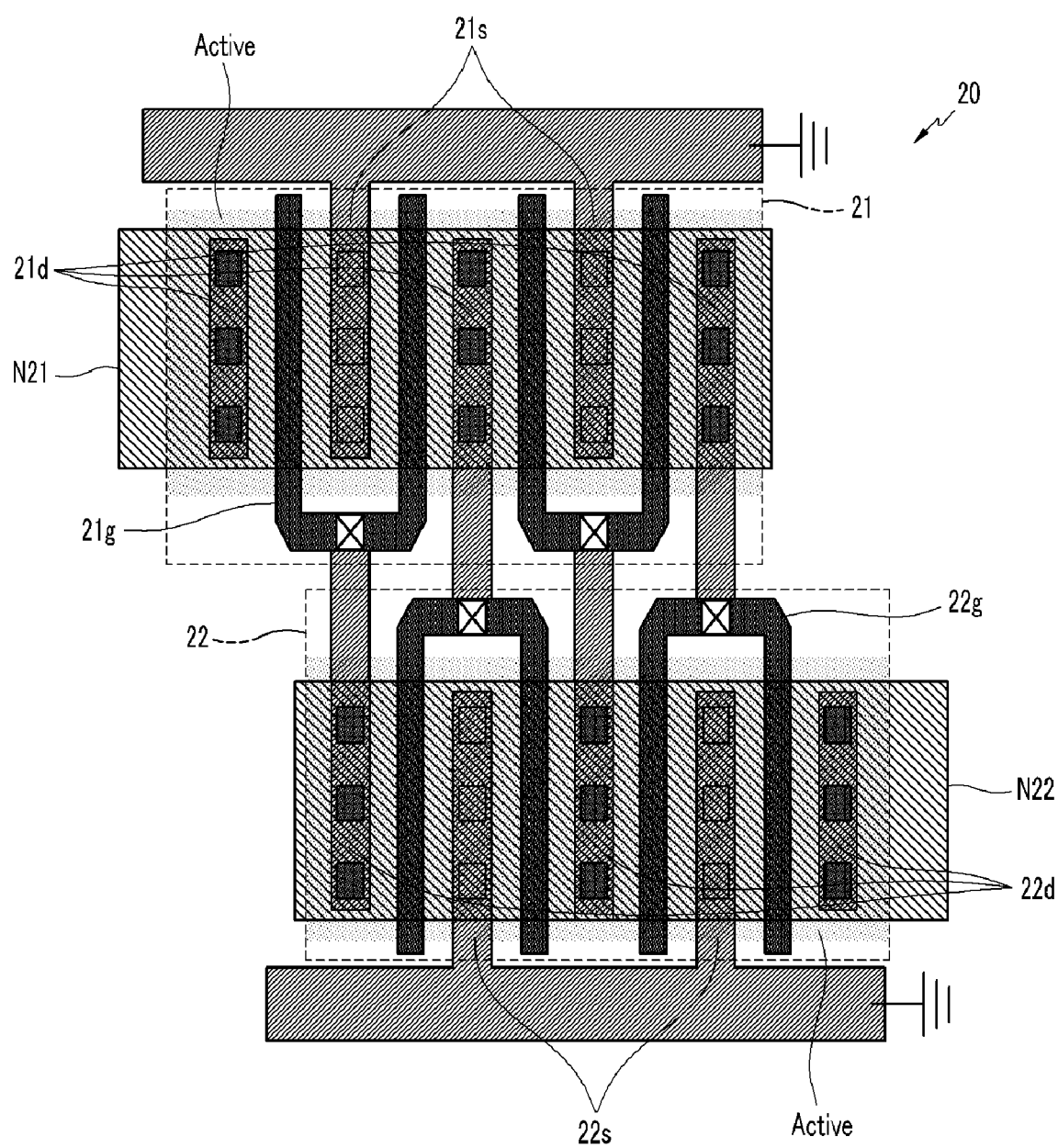
FIG. 3 is a detailed schematic diagram of a negative resistance cell 20 included in a general RF differential voltage controlled oscillator.

FIG. 3 is a detailed schematic diagram of a negative resistance cell 20 included in a general RF differential voltage controlled oscillator.

As shown in FIG. 3, the negative resistance cell 20 included in the general RF differential voltage controlled oscillator is formed by a switch including a transistor 21 and a transistor 22.

A drain 21d of the transistor 21 is coupled to a node N21 coupled to an LC tank (not shown), and a source 21s thereof is grounded.

A drain 22d of the transistor 22 is coupled to a node N22 coupled to the LC tank (not shown), and a source 22s thereof is grounded.

A gate 21g of the transistor 21 is coupled to the drain 22d of the transistor 22, and a gate 22g of the transistor 22 is coupled to the drain 21d of the transistor 21.

The drains 21d and 22d of the transistors 21 and 22 have a junction with the active area. Also, while not shown in FIG. 3, the sources 21s and 22s of the transistors 21 and 22 have a junction with the active area.

The negative resistance cell 20 shown in FIG. 3 arranges the two transistors 21 and 22 asymmetrically so that the gate 21g of the transistor 21 is coupled to the drain 22d of the transistor 22 and the gate 22g of the transistor 22 is coupled to the drain 21d of the transistor 21. That is, the negative resistance cell 20 shown in FIG. 3 includes no superimposition structure, differing from the negative resistance cell 10 shown in FIG. 2, and thus generates a lesser parasitic component compared to the negative resistance cell 10 shown in FIG. 2. Because of the reduction of the parasitic component, the negative resistance cell 20 shown in FIG. 3 improves the Q factor of the LC tank (200 in FIG. 1) compared to the negative resistance cell 10 shown in FIG. 2, and thus acquires improved phase noise performance. The negative resistance cell 20 shown in FIG. 3 can realize the output frequency bandwidth of the differential voltage controlled oscillator to be greater than that of the negative resistance cell 10 shown in FIG. 2. Also, the negative resistance cell 20 shown in FIG. 3 increases the change of the capacitance of the capacitor corresponding to the voltage input to the capacitor included in the LC tank (200 in FIG. 1) compared to the negative resistance cell 10 shown in FIG. 2, and hence, it realizes the improved broadband characteristic.

However, it is required for the negative resistance cell 20 shown in FIG. 3 to increase the number of the drains 21d and 22d by one for the respective transistors 21 and 22 compared to the negative resistance cell 10 shown in FIG. 2 in order to couple the drain and the source of the two transistors 21 and 22 that are arranged asymmetrically. Also, because of the nodes N21 and N22, a parasitic capacitance component is generated between the gate 21g of the transistor 21 and the drain 21d of the transistor 21 and between the gate 22g of the transistor 22 and the drain 22d of the transistor 22. Also, the negative resistance cell 20 shown in FIG. 3 may generate a mismatch caused by a gradient because of the asymmetric structure of the two transistors 21 and 22. The gradient may differentiate the lengths of the connection metal lines between the two transistors 21 and 22 and the LC tank (not shown), and hence, the symmetry between the transistor 21 and the transistor 22 with reference to the LC tank cannot be guaranteed. This asymmetry worsens the phase noise performance, and deteriorates the performance of the differential voltage controlled oscillator.

A negative resistance cell 100 that is suitable for realizing the RF differential voltage controlled oscillator by minimizing the parasitic component compared to the negative resistance cells 10 and 20 shown in FIG. 2 and FIG. 3, and for minimizing the realization area according to an exemplary embodiment of the present invention, will now be described with reference to FIG. 4.

Figure 4:
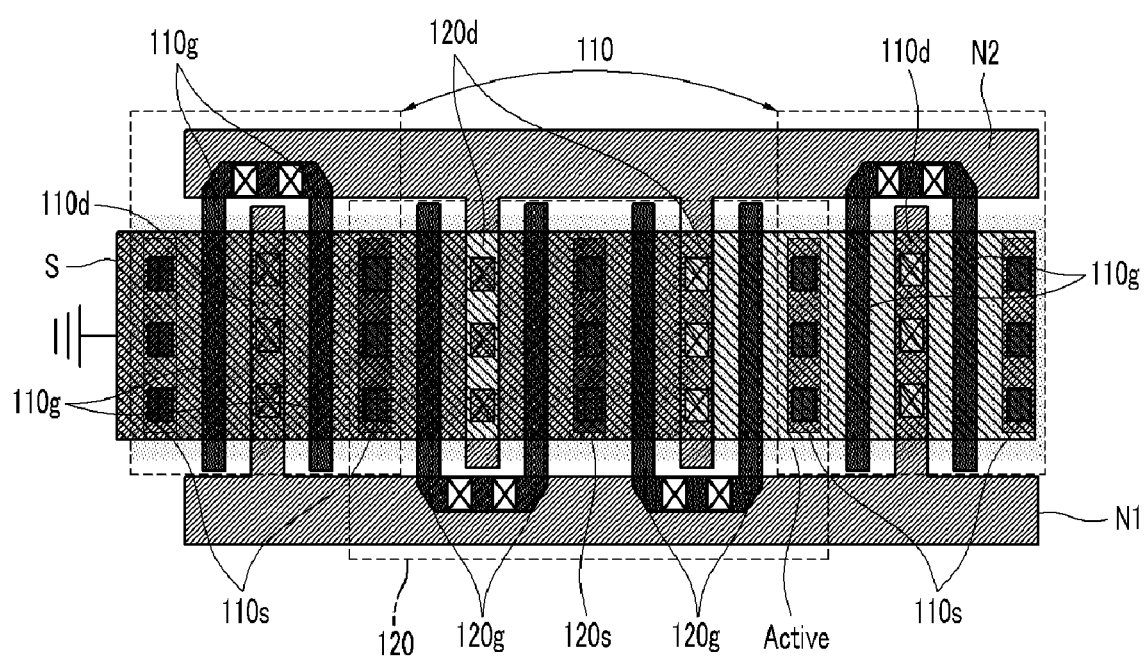
FIG. 4 is a detailed schematic diagram of a negative resistance cell 100 according to an exemplary embodiment of the present invention.

FIG. 4 is a detailed schematic diagram of a negative resistance cell 100 according to an exemplary embodiment of the present invention.

As shown in FIG. 4, the negative resistance cell 100 is formed by a switch including a transistor 120 arranged symmetrically, and a transistor 110 arranged symmetrically to the right and left of the transistor 120. The negative resistance cell 100 shown in FIG. 4 has a common-centroid structure for the transistor 110 and the transistor 120. The negative resistance cell 100 shown in FIG. 4 will now be described.

The node N1 and the node N2 are formed as parallel signal lines. The gate 110g, drain 110d, and source 110s of the transistor 110 are provided between the node N1 and the node N2. The gate 120g, drain 120d, and source 120s of the transistor 120 are provided between the node N1 and the node N2. The electrodes are formed in the order of gate 110g, drain 110d, the gate 110g, the source 110s of the transistor 110, the gate 120g, the drain 120d, the gate 120g, the source 120s, the gate 120g, the drain 120d, the gate 120g of the transistor 120, the source 110s, the gate 110g, the drain 110d, and the gate 110g of the transistor 110.

The drains 110d and 120d of the transistors 110 and 120 have a junction with the active area. Also, while not shown in FIG. 4, the sources 110s and 120s of the transistors 110 and 120 have a junction with the active area.

The negative resistance cell 100 shown in FIG. 4 is formed so that the transistor 110 and the transistor 120 respectively share the sources 110s and 120s, and the sources are grounded through the common source connector (S). Accordingly, the number of sources is reduced by 1 compared to the general negative resistance cell 10 shown in FIG. 2. Also, the general negative resistance cell 20 shown in FIG. 3 has a structure that requires 3 drains for 4 gates, and the negative resistance cell 100 according to the exemplary embodiment of the present invention requires 2 drains for 4 gates. That is, the negative resistance cell 100 has fewer drains than the general negative resistance cell 20 by 2, and hence, the parasitic component, that is, the parasitic capacitor component generated between the drains 110d and 120d and the sources 110s and 120s, is reduced. Because of the reduction of the parasitic components, the negative resistance cell 100 improves the Q factor of the LC tank (200 in FIG. 1) compared to the general negative resistance cell 20 shown in FIG. 3, and thus realizes improved phase noise performance. Also, the negative resistance cell 100 increases the change of capacitance of the capacitor corresponding to the input voltage of the capacitor included in the LC tank (200 in FIG. 1) compared to the general negative resistance cell 20 shown in FIG. 3, and thus realizes the improved broadband characteristic.

Also, the negative resistance cell 100 shown in FIG. 4 forms a structure in which the node N1 coupled to the gate 110d of the transistor 110 is completely symmetrical with the node N2 coupled to the gate 120d of the transistor 120, differing from the general negative resistance cell 20 shown in FIG. 3. That is, the transistors 110 and 120 are formed in the linear symmetric format with respect to the common source 120S. Because of the common-centroid structure, the negative resistance cell 100 can minimize generation of the parasitic component and generation of a mismatch caused by a gradient, and thus improves phase noise performance.

In FIG. 4, the transistor 120 is shown to be formed nearer to the common source 120s that is the axis of the linear symmetry than the transistor 110, and differing from this, the transistor 110 can be formed nearer to the common source 120s than the transistor 120. Also, the gate 110g and 120g of the transistors 110 and 120 are coupled to the nodes N1 and N2. In detail, the gap between the node N1 and the node N2 is formed to be within the range of the lengths of the gates 110g and 120g of the transistors 110 and 120, and hence, the heat and the realization area of the parasitic component can be reduced compared to the negative resistance cells 10 and 20 included in the general differential voltage controlled oscillator shown in FIG. 2 and FIG. 3.

The transistors 110 and 120 included in the negative resistance cell 100 according to the exemplary embodiment of the present invention shown in FIG. 4 are applicable to other elements having the cross coupled transistor structure in addition to the differential voltage controlled oscillator 1000 according to the exemplary embodiment of the present invention.

Figure 5:
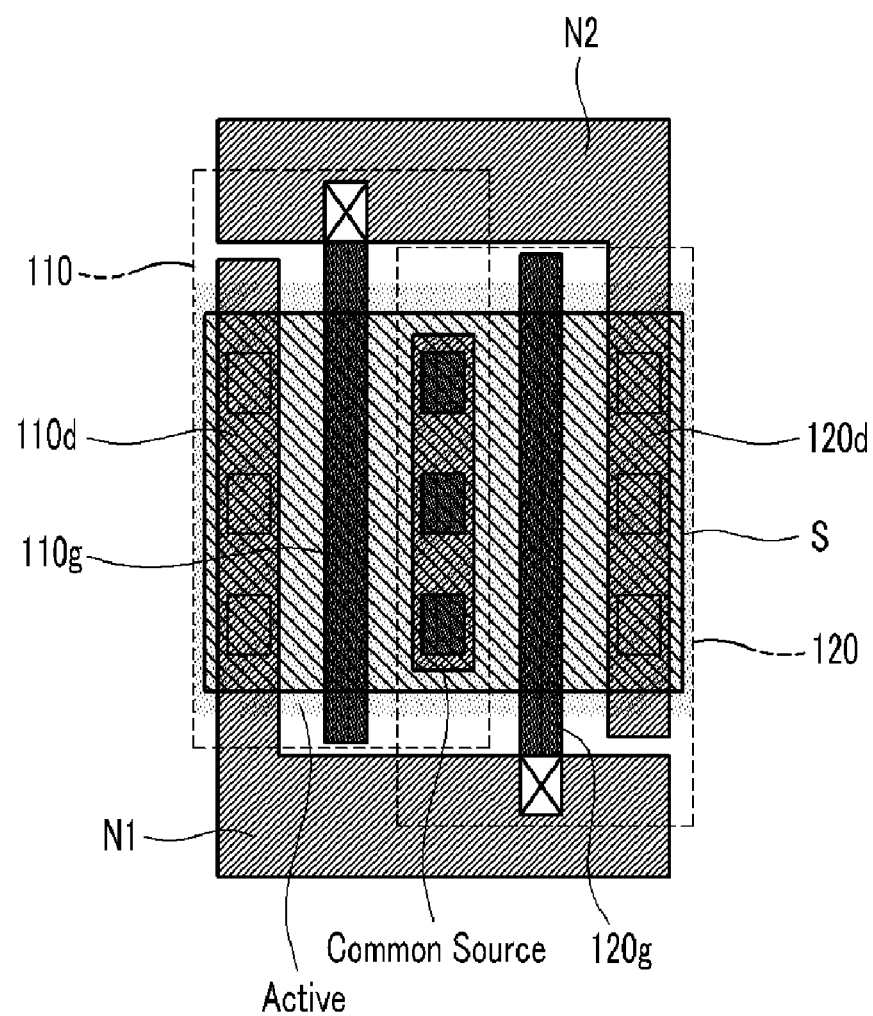
FIG. 5 shows a structure of a minimum unit cell included in a negative resistance cell 100 according to an exemplary embodiment of the present invention shown in FIG. 4.

FIG. 5 is a structure of a minimum unit cell included in a negative resistance cell 100 according to an exemplary embodiment of the present invention shown in FIG. 4. Here, a minimum unit cell represents a switch including transistors 110 and 120 driven in correspondence to two different control signals, and the negative resistance cell 100 can be formed with one minimum unit cell.

As shown in FIG. 5, the transistor 110 and the transistor 120 of the minimum unit cell included in the negative resistance cell 100 according to the exemplary embodiment of the present invention share a common source. The minimum unit cell structure shown in FIG. 5 will now be described in detail.

The node N1 and the node N2 are formed as parallel signal lines. The gate 110g of the transistor 110 is provided in parallel to the common source, and is coupled to the node N2. The drain 100d of the transistor 110 is provided to the opposite side of the common source with respect to the gate 110g, and is coupled to the node N1. The gate 120g of the transistor 120 is provided to the opposite side of the gate 110g of the transistor 110 with respect to the common source, and is coupled to the node N1. The drain 120d of the transistor 120 is provided to the opposite side of the common source with respect to the gate 120g, and is coupled to the node N2.

The drains 110d and 120d of the transistors 110 and 120 have a junction with the active area. Also, while not shown in FIG. 5, the sources 110s and 120s of the transistors 110 and 120 have a junction with the active area.

Here, the common source is coupled to the common source connector (S) and is then grounded. Further, the gate 110g of the transistor 110 and the drain 120d of the transistor 120, and the gate 120g of the transistor 120 and the drain 110d of the transistor 110, are set to not be superimposed with each other. Hence, the length of the connection line for forming the minimum unit cell is minimized.

The minimum unit cell structure shown in FIG. 5 can be selected as the standard cell for the library provided by the general semiconductor process. When the minimum unit cell structure shown in FIG. 5 is used as the standard cell, the extended form of the standard cell can be realized as the same format as the negative resistance cell 100 according to the exemplary embodiment of the present invention shown in FIG. 4, and can also be realized as a format that is different from the negative resistance cell 100 according to the exemplary embodiment of the present invention shown in FIG. 4. The negative resistance cell 100 minimizes the switch structure, minimizes the number of drains 110d and 120d and sources 110s and 110s of the transistors 110 and 120, and is formed in the common-centroid structure for solving the mismatch during the process. Accordingly, the negative resistance cell 100 improves the Q factor of the LC tank 200 to improve phase noise performance, and improves the performance of the differential voltage controlled oscillator 1000 for outputting the RF band oscillation frequency. Also, the negative resistance cell 100 increases the change of capacitance of the capacitor corresponding to the input voltage of the capacitor included in the LC tank 200, and realizes the improved broadband characteristic. Therefore, the negative resistance cell 100 allows the realization of the differential voltage controlled oscillator 1000 for outputting the RF broadband oscillation frequency.

The transistors 110 and 120 shown in FIG. 4 and FIG. 5 can be realized with various types of switches including a complimentary metal oxide semiconductor (CMOS) and a bipolar junction transistor (BJT).

The above-described embodiments can be realized through a program for realizing functions corresponding to the configuration of the embodiments or a recording medium for recording the program in addition to through the above-described device and/or method, which is easily realized by a person skilled in the art.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A differential voltage controlled oscillator comprising:
   a resonator for generating an oscillation frequency corresponding to an input voltage;

a first output terminal and a second output terminal, respectively coupled to a first terminal and a second terminal of the resonator, for outputting the oscillation frequency; and a negative resistance cell driven in correspondence to the oscillation frequency, wherein the negative resistance cell includes a switch, and the switch includes a first signal line extended in a first direction, a second signal line formed to be parallel with the first signal line, a source electrode formed between the first and second signal lines, a first gate electrode arranged to be parallel with the source electrode and coupled to the first signal line, a second gate electrode provided to the opposite side of the first gate electrode with respect to the source electrode, and coupled to the second signal line, a first drain electrode provided to the opposite side of the source electrode with respect to the first gate electrode, and coupled to the second signal line, and a second drain electrode provided to the opposite side of the source electrode with respect to the second gate electrode, and coupled to the first signal line.

2. The differential voltage controlled oscillator of claim 1, wherein the first signal line is coupled to a first terminal of the resonator, and the second signal line is coupled to a second terminal of the resonator.

3. The differential voltage controlled oscillator of claim 2, wherein the source electrode is coupled to a first power unit for supplying a first voltage.

4. A differential voltage controlled oscillator comprising:

a resonator for generating an oscillation frequency corresponding to an input voltage;

a first output terminal and a second output terminal, respectively coupled to a first terminal and a second terminal of the resonator, for outputting the oscillation frequency; and a negative resistance cell driven in correspondence to the oscillation frequency, wherein the negative resistance cell includes a switch, and the switch includes a first signal line extended in a first direction, a second signal line formed to be parallel with the first signal line, and a first gate electrode to a fourth gate electrode, a first source electrode to a third source electrode, and a first drain electrode to a fourth drain electrode formed between the first signal line and the second signal line, wherein the electrodes are formed in the order of the first gate electrode, the first drain electrode, the second gate electrode, the first source electrode, the third gate electrode, the second drain electrode, the fourth gate electrode, the second source electrode, the fifth gate electrode, the third drain electrode, the sixth gate electrode, the third source electrode, the seventh gate electrode, the fourth drain electrode, and the eighth gate electrode.

5. The differential voltage controlled oscillator of claim 4, wherein the first, second, seventh, and eighth gate electrodes, the second and third drain electrodes are coupled to the first signal line, and the third, fourth, fifth, and sixth gate electrodes and the first and fourth drain electrodes are coupled to the second signal line.

6. The differential voltage controlled oscillator of claim 4, wherein the switch forms linear symmetry with respect to the second source electrode.

7. The differential voltage controlled oscillator of claim 4, wherein the first signal line is coupled to a first terminal of the resonator, and the second signal line is coupled to a second terminal of the resonator.

8. The differential voltage controlled oscillator of claim 7, wherein the first to third source electrodes are coupled to a first power unit for supplying a first voltage.

9. A negative resistance cell, included in a differential voltage controlled oscillator for outputting an oscillation frequency corresponding to an input voltage through a first output terminal and a second output terminal, including a switch driven corresponding to the oscillation frequency, wherein the switch includes:

a first signal line extended in a first direction;

a second signal line formed to be parallel with the first signal line;

a source electrode formed between the first and second signal lines;

a first gate electrode arranged to be parallel with the source electrode and coupled to the first signal line;

a second gate electrode provided to the opposite side of the first gate electrode with respect to the source electrode, and coupled to the second signal line;

a first drain electrode provided to the opposite side of the source electrode with respect to the first gate electrode, and coupled to the second signal line; and a second drain electrode provided to the opposite side of the source electrode with respect to the second gate electrode, and coupled to the first signal line.

10. The negative resistance cell of claim 9, wherein the differential voltage controlled oscillator including a resonator for generating the oscillation frequency corresponding to the input voltage, wherein the first signal line is coupled to a node of a first terminal of the resonator and the first output terminal, and the second signal line is coupled to a node of a second terminal of the resonator and the second output terminal.

11. The negative resistance cell of claim 10, wherein the source electrode is coupled to a first power unit for supplying a first voltage.

12. A negative resistance cell, included in a differential voltage controlled oscillator for outputting an oscillation frequency corresponding to an input voltage through a first output terminal and a second output terminal, including a switch driven corresponding to the oscillation frequency, wherein the switch includes:

a first signal line extended in a first direction;

a second signal line formed to be parallel with the first signal line; and a first gate electrode to a fourth gate electrode, a first source electrode to a third source electrode, and a first drain electrode to a fourth drain electrode formed between the first signal line and the second signal line, and wherein the electrodes are formed in the order of the first gate electrode, the first drain electrode, the second gate electrode, the first source electrode, the third gate electrode, the second drain electrode, the fourth gate electrode, the second source electrode, the fifth gate electrode, the third drain electrode, the sixth gate electrode, the third source electrode, the seventh gate electrode, the fourth drain electrode, and the eighth gate electrode.

13. The negative resistance cell of claim 12, wherein
the first, second, seventh, and eighth gate electrodes, the second and third drain electrodes are coupled to the first signal line, and
the third, fourth, fifth, and sixth gate electrodes and the first and fourth drain electrodes are coupled to the second signal line.

14. The negative resistance cell of claim 12, wherein
the switch forms linear symmetry with respect to the second source electrode.

15. The negative resistance cell of claim 12, wherein the differential voltage controlled oscillator including a resonator for generating the oscillation frequency corresponding to the input voltage, wherein
the first signal line is coupled to a node of a first terminal of the resonator and the first output terminal, and the second signal line is coupled to a node of a second terminal of the resonator and the second output terminal.

16. The negative resistance cell of claim 15, wherein
the first to third source electrodes is coupled to a first power unit for supplying a first voltage.

17. A switch comprising:
a first signal line extended in a first direction;
a second signal line formed to be parallel with the first signal line;
a source electrode formed between the first and second signal lines;
a first gate electrode arranged to be parallel with the source electrode and coupled to the first signal line;
a second gate electrode provided to the opposite side of the first gate electrode with respect to the source electrode, and coupled to the second signal line;
a first drain electrode provided to the opposite side of the source electrode with respect to the first gate electrode, and coupled to the second signal line; and
a second drain electrode provided to the opposite side of the source electrode with respect to the second gate electrode, and coupled to the first signal line.

18. A switch comprising:
a first signal line extended in a first direction;
a second signal line formed to be parallel with the first signal line; and
a first gate electrode to a fourth gate electrode, a first source electrode to a third source electrode, and a first drain electrode to a fourth drain electrode formed between the first signal line and the second signal line,
wherein the electrodes are formed in the order of the first gate electrode, the first drain electrode, the second gate electrode, the first source electrode, the third gate electrode, the second drain electrode, the fourth gate electrode, the second source electrode, the fifth gate electrode, the third drain electrode, the sixth gate electrode, the third source electrode, the seventh gate electrode, the fourth drain electrode, and the eighth gate electrode.

19. The switch of claim 18, wherein
the first, second, seventh, and eighth gate electrodes are the second and third drain electrodes are coupled to the first signal line, and
the third, fourth, fifth, and sixth gate electrodes are coupled to the second signal line.

20. The switch of claim 18, wherein
the switch forms linear symmetry with respect to the second source electrode.

* * * * *